(12) United States Patent
Inazu

(10) Patent No.: US 9,634,656 B2
(45) Date of Patent: Apr. 25, 2017

(54) CURRENT DRIVER CIRCUIT

(71) Applicant: DENSO CORPORATION, Kariya, Aichi-pref. (JP)

(72) Inventor: Kenji Inazu, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/000,133

(22) Filed: Jan. 19, 2016

(65) Prior Publication Data

US 2016/0218709 A1 Jul. 28, 2016

(30) Foreign Application Priority Data

Jan. 23, 2015 (JP) .................................. 2015-11227

(51) Int. Cl.
*H03K 3/00* (2006.01)
*H03K 17/0412* (2006.01)
*H03K 17/12* (2006.01)

(52) U.S. Cl.
CPC ..... *H03K 17/04123* (2013.01); *H03K 17/122* (2013.01)

(58) Field of Classification Search
CPC .................................................. H03K 17/6871
USPC ........ 327/170–175, 108–112, 427, 434, 437, 327/270, 276, 543, 538; 326/30, 82, 83, 326/87
See application file for complete search history.

(56) References Cited

U.S. PATENT DOCUMENTS

| 4,596,979 | A | * | 6/1986 | Sisson | ................... | H03M 1/745 |
| | | | | | | 341/136 |
| 6,844,837 | B1 | * | 1/2005 | Sutardja | ................... | H03K 5/01 |
| | | | | | | 341/144 |
| 2003/0151567 | A1 | | 8/2003 | Hanada et al. | | |
| 2006/0279260 | A1 | * | 12/2006 | Tsuge | ..................... | G09G 3/006 |
| | | | | | | 322/44 |

FOREIGN PATENT DOCUMENTS

JP 2006-339458 A 12/2006
JP 3868836 B2 1/2007

* cited by examiner

*Primary Examiner* — Lincoln Donovan
*Assistant Examiner* — Thomas Skibinski
(74) *Attorney, Agent, or Firm* — Posz Law Group, PLC

(57) ABSTRACT

A current driver circuit includes: a current conversion unit including an input side transistor, in which a reference current is input, and multiple output side transistors, which output an output current corresponding to the reference current, and having an digital-analog conversion function for converting a digital control signal to an analog signal and a current amplifying function for amplifying the reference current according to an amplification ratio corresponding to the digital control signal; and an adjustment unit adjusting the digital control signal to be input into the output side transistors. When the adjustment unit adjusts the digital control signal, the current conversion unit changes the amplification ratio to gradually increase or decrease the output current, and controls a slew rate of the output current within a predetermined range.

17 Claims, 10 Drawing Sheets

FIG. 8

| VAL | BINARY CODE | GRAY CODE |
|---|---|---|
| 0 | 0000 | 00000000 |
| 1 | 0001 | 00000001 |
| 2 | 0010 | 00000011 |
| 3 | 0011 | 00000111 |
| 4 | 0100 | 00001111 |
| 5 | 0101 | 00011111 |
| 6 | 0110 | 00111111 |
| 7 | 0111 | 01111111 |
| 8 | 1000 | 11111111 |

OUT CUR WAVEFORM WITH NO DELAY
(GRADUAL INCR)

OUT CUR WAVEFORM WITH DELAY
(GRADUAL INCR)

OUT CUR WAVEFORM WITH NO DELAY
(GRADUAL DECR)

OUT CUR WAVEFORM WITH DELAY
(GRADUAL DECR)

CURRENT DRIVER CIRCUIT

CROSS REFERENCE TO RELATED APPLICATION

This application is based on Japanese Patent Application No. 201541227 filed on Jan. 23, 2015, the disclosure of which is incorporated herein by reference.

TECHNICAL FIELD

The present disclosure relates to a current driver circuit for outputting current.

BACKGROUND

In general, digitally controlled current driver circuits that can change output current magnitude by changing digital signals are presented. For example, JP-3868836 B2 shows it. In JP-3868836 B2 discloses circuit topology having a D/A converter and a current amplifier. The D/A converter is constructed by a bipolar transistor or a MOS transistor. The current amplifier amplifies the current from the D/A converter. Current driver circuits are used for circuits for LED driving, organic EL driving or communication.

When a technique in JP-3868836 B2 is applied, area of circuit is increased since the current amplifier is necessary after the output terminal of the D/A converter. Further, if the circuit topology shown in JP-3868836 B2 is applied with the current amplifier provided by the MOS transistor, slew rate of the output current waveform is degraded since the response of the output current changing can not be with the fast input current changing.

SUMMARY

The objective of this present disclosure is to realize a current driver circuit with small area by using MOS transistors for high slew rate output current.

According to an example aspect of the present disclosure, a current driver circuit includes: a current conversion unit including an input side transistor, in which a predetermined reference current is input, and a plurality of output side transistors, which output an output current corresponding to the predetermined reference current flowing through the input side transistor, and having an digital-analog conversion function for converting a digital control signal, which is input into the current conversion unit, to an analog signal and a current amplifying function for amplifying the reference current according to an amplification ratio corresponding to the digital control signal the digital-analog conversion function and the current amplifying function being integrated into the current conversion unit; and an adjustment unit adjusting the digital control signal to be input into the plurality of output side transistors. When the adjustment unit adjusts the digital control signal, the current conversion unit changes the amplification ratio to gradually increase or decrease the output current from the plurality of output side transistors, and controls a slew rate of the output current to be within a predetermined range.

In the above current driver circuit, even if a MOS transistor is used in the current driver circuit, the output current has a current waveform with high slew rate since a waveform of an input current is constant.

BRIEF DESCRIPTION OF THE DRAWINGS

The above and other objects, features and advantages of the present disclosure will become more apparent from the following detailed description made with reference to the accompanying drawings. In the drawings:

FIG. 76 is a graph showing an actual output current waveform;

FIG. 8 is a diagram showing a binary code and a gray code;

DETAILED DESCRIPTION

A current driver circuit according to embodiments will be explained with reference to drawings when the current driver circuit is used in a digital transmission device for executing multilevel communication based on communication standards for vehicles such as a DSI3 (i.e., distributed system interface 3). In each embodiment, a feature having the same or similar function is put by the same or similar reference number.

First Embodiment

Figure 2A:
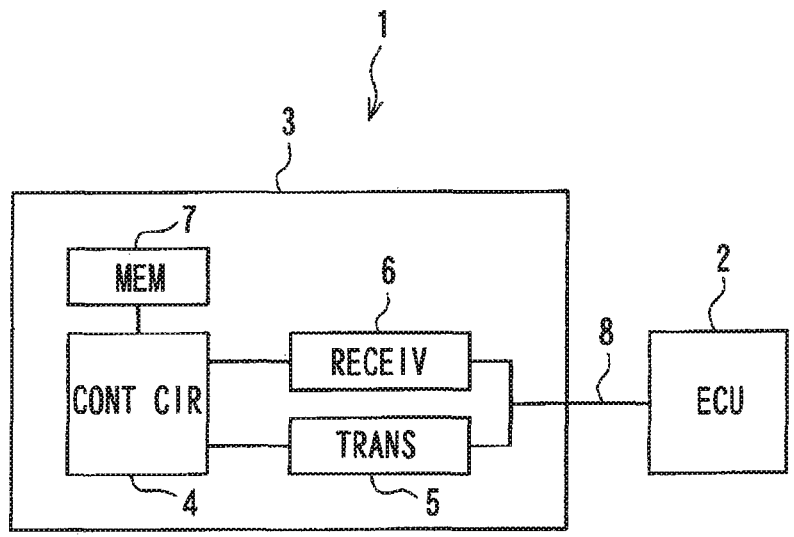
FIG. 2A is a block diagram showing a master slave system.

As shown in FIG. 2A, a master slave system 1 for a vehicle includes a ECU (i.e., electronic control unit) 2 as a master and a sensor device 3 as a slave. The communication is performed between the ECU 2 and the sensor device 3. The sensor device 3 includes a control circuit 4, a transmitter 5 as a current driver circuit, a receiver 6 and a memory 7. The ECU 2 has a similar construction as the sensor device 3. Specifically, the ECU 2 includes the control circuit, the transmitter, the receiver, the memory and the like.

The ECU 2 is connected to the sensor device 3 through a transmission line 8. The ECU 2 transmits a command to the sensor device 3 by changing voltage level of the transmission line 8. When the sensor device 3 responds to the command transmitted from the ECU 2, the sensor device 3 changes a current level, which flows in the transmission line 8, so that the sensor device 3 responds to the ECU 2. For example, when the DSI3 standards are considered, the voltage level indicated in the transmission command from the ECU 2 is a binary level such as Vhigh and Vlow. The current level indicated in the response data of the sensor device 3 is a ternary level, i.e., Iq, Iresp and 2×Iresp. Here, Iq is zero mA, Iresp is 12 mA±1.5 mA, and 2×Iresp is 24 mA±3 mA.

Figure 3:
FIG. 3 is a diagram showing a conversion table defined in communication standards.

The construction of the sensor device 3 will be explained. The control circuit 4 includes a control logic and a CPU, for example. The sensor device 3 stores a conversion table 11 shown in FIG. 3 in the memory 7. The control circuit 4 converts the binary data with every four bits as a unit, as the binary instruction response data for responding to the ECU 2 from the sensor device 3, to the ternary symbol for three chips based on the conversion table. Then, the control circuit 4 outputs the ternary symbol to the transmitter 5. For example, when the binary data is "1100," the control circuit 4 of the sensor device 3 as a communication control circuit converts the instruction value in the binary data to the value of "120" in the ternary symbol for three chips, and outputs the ternary symbol to the transmitter 5.

Figure 2B:
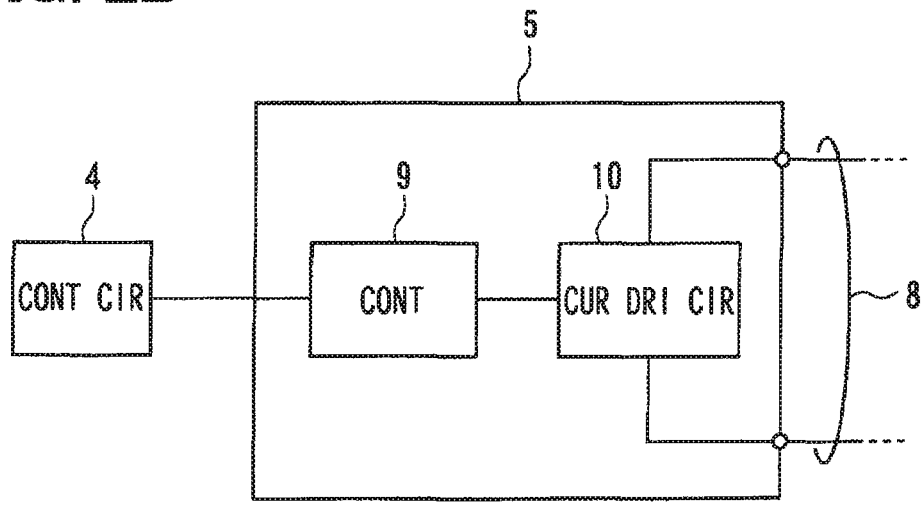
FIG. 2B is a block diagram showing an inside structure of a transmitter.
Figure 4:
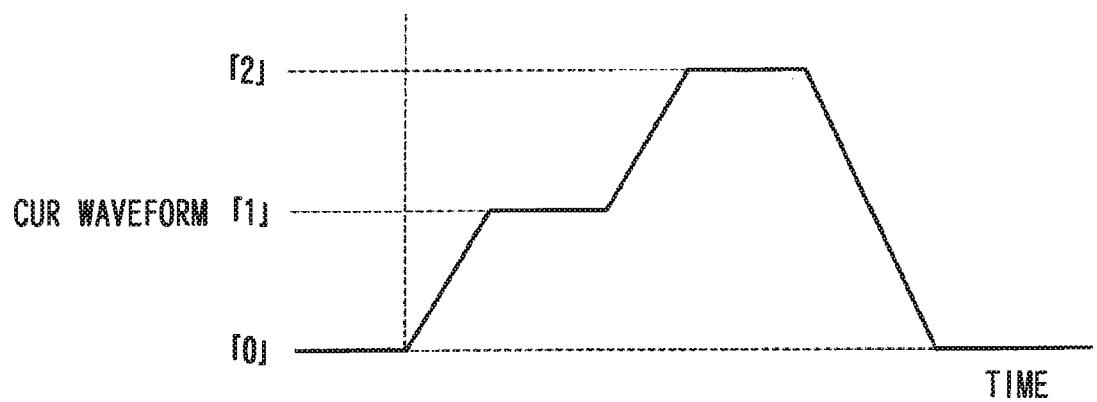
FIG. 4 is a graph showing a target output current waveform defined in the communication standards.

As shown in FIG. 2B indicative of the construction of the transmitter 5, the transmitter 5 includes the controller 9 and the current drive circuit 10. The clock signal for operation (not shown) is input into the controller 9. When the instruction value of the ternary symbol for three chips is input from the control circuit 4, the ternary symbol in the three chips is converted at each chip. The controller 9 generates a control signal gradually changing to the final value data corresponding to the ternary symbol for each chip in turn. Then, the controller 9 outputs the control signal to the current drive circuit 10 through a bus (i.e., by a bus outputting manner). In this manner, the controller 9 functions as the transmitter control circuit. The gradation number of the control signal output from the controller 9 is preliminary determined such that the output waveform approaches an ideal current output waveform, as shown in FIG. 4. Here, we shows an example that the gradation number is nine, and the control signal is eight bits. The controller 9 generates the eight bit data of "00000000" in the control signal as the final value when the ternary symbol of the instruction value is "0," generates the eight bit data of "00001111" in the control signal as the final value when the ternary symbol of the instruction value is "1," and generates the eight bit data of "11111111" in the control signal as the final value when the ternary symbol of the instruction value is "2." Thus, the controller 9 generates the control signal in turn from a previous final value to a current final value, and then, outputs the control signal to the current drive circuit 10. The concrete example will be explained later.

The current drive circuit 10 converts the control signal to the current signal, and outputs the current signal to the transmission line 8. FIG. 4 shows an example of the ideal current output waveform when the ternary symbol for three chips is "120" in the DSI3 standards. When the sensor device 3 outputs the current signal to the ECU 2, $R_1$ (equal to 0 mA) when the ternary symbol is "0," I resp (equal to 12 mA±1.5 mA) when the ternary symbol is "1," and 2×Iresp (equal to 24 mA±3 mA) when the ternary symbol is "2" are output. In this case, the current transition time from "0" to "1" and the current transition time from "1" to "2" are not defined. However, the current transition time from "2" to "0," i.e., from 90% to 10%, as a settling time is defined to be in a range between 0.33 microseconds and 1.00 microseconds.

Figure 1:
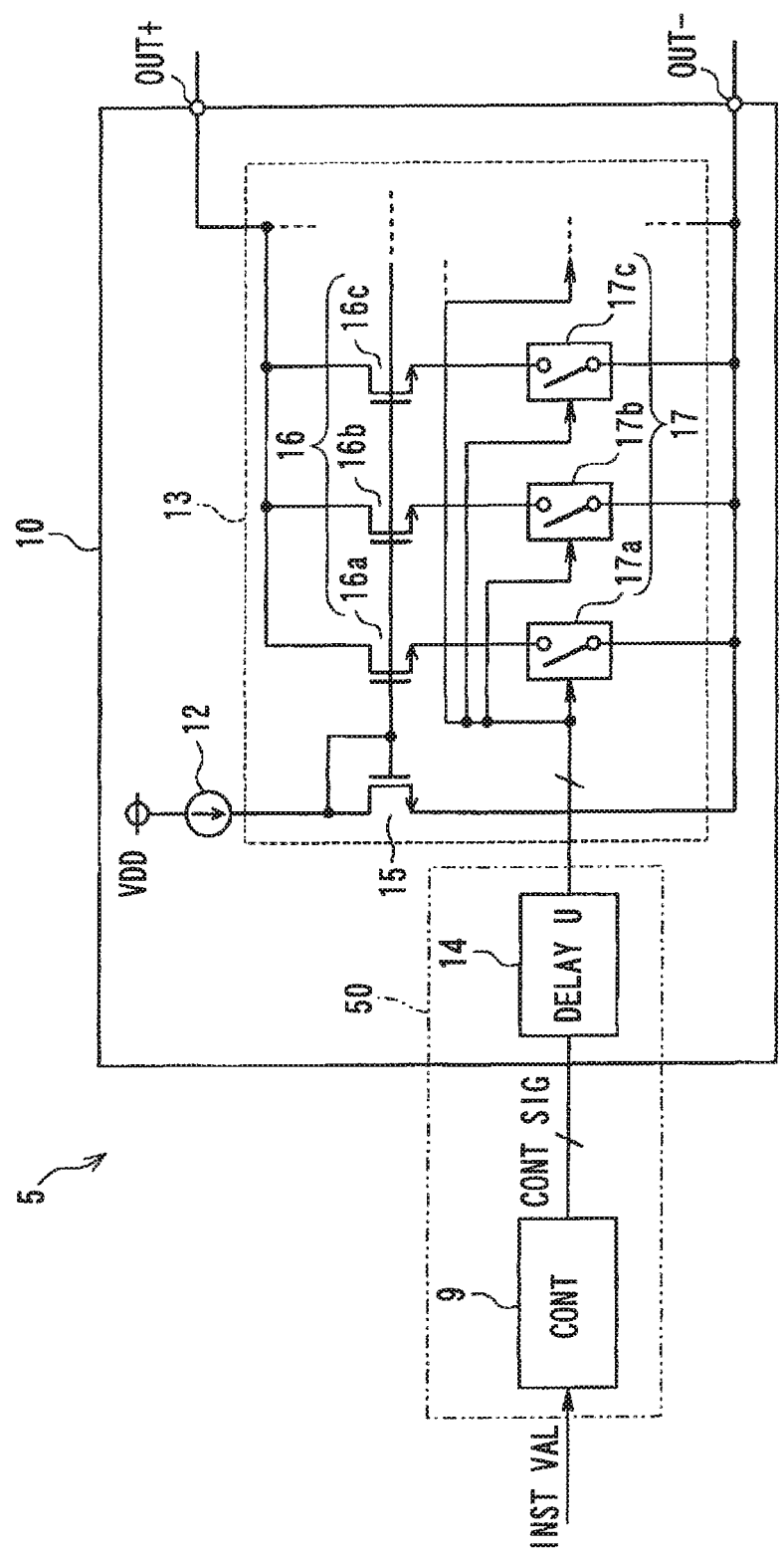
FIG. 1 is a circuit diagram showing a current driver circuit according to a first embodiment.

As shown in FIG. 1, the current drive circuit 10 includes the reference current source 12, the current conversion unit 13 having the D/A conversion function and the current amplifying function, and the delay unit 14. The current drive circuit 10 outputs the signal current from the output terminals OUT+, OUT− according to the control signal input from the controller 9, for example. The controller 9 and the delay unit 14 provide an adjustment unit 50.

The current conversion unit 13 includes an input side transistor 15, multiple output side transistors 16, and multiple output side switches 17. The input side transistor 15 is connected in series with the reference current source 12. Multiple output side transistors 16 includes, for example, eight transistors 16a-16h for outputting current with reference to the standard current flowing through the input side transistor 15 as a reference. The switches 17 as a switching circuit include, for example, eight switches 17a-17h, each of which is connected in series with a corresponding output side transistor 16a-16h, respectively. Here, a part of or all of the output side transistors 16a-16h is generally defined as the output side transistors 16 if necessary. A part of or all of the switches 17a-17h is generally defined as the switches 17 if necessary.

The input side transistor 15 is provided by a N channel MOSFET. Each output side transistor 16 is provided by one N channel MOSFET or multiple N channel MOSFETS, which are connected in parallel to each other. Each switch 17 is provided by, for example, a N channel MOSFET. The switch 17 is connected between a source of the MOSFET, which provides the output side transistor 16, and a ground. The control signal of the controller 9 is input into the control terminal through the delay unit 14 so that the switch 17 is switchable between an on state and an off state. Here, the switch 17 is connected to the source of the MOSFET for providing the output side transistor 16. Alternatively, the switch 17 may be connected to the gate or the drain of the MOSFET for providing the output side transistor 16.

For example, when the switch 17 is arranged at the gate of the MOSFET for providing the output side transistor 16, a gate node voltage of the transistor 16 is variable easily, so that the output current in accordance with the gate node voltage is also changeable easily. Thus, in this case, a circuit for restricting the influence of the variation of the output current may be arranged.

Further, for example, when the switch 17 is arranged at the drain of the MOSFET for providing the output side transistor 16, a channel is continuously formed in the output side transistor 16 even if the switch 17 turns off. Accordingly, when the switch is changed to the on state, the transistor 16 operates in linear region at the beginning and after while, the transistor 16 changes operating region to saturated. During this change, the current variation may be large. Accordingly, a circuit for restricting the influence of the current variation may be arranged.

On the other hand, in a case where the switch 17 is connected to the source of the output side transistor 16, the voltage between the gate and the source (Vgs) in the MOSFET for providing the output side transistor 16 becomes zero when the switch 17 turns off. Then, when the switch 17 turns on, the current flowing through the output side transistor 16 is gradually increased. Thus, it is not necessary to remove the influence in a case where the switch 17 is arranged at the gate or the drain of the MOSFET for providing the output side transistor 16, so that a circuit topology is simplified. In the switch 17, the control signal is input into the control terminal as the gate terminal through the delay unit 14 from the controller 9.

The input side transistor 15 and the output side transistor 16 have the same gate width and the same gate length. Here, the number of the input side transistors 15 connected to the reference current source 12 and the number of the output side transistors 16 connected to one switch 17 are determined to be a certain integer ratio according to the current amplification ratio.

The controller 9 outputs the control signal (i.e., the digital control signal) to the switch 17 in synchronization with a clock signal. When the control signal is input into the switch 17 through the delay unit 14, the switch 17 turns on and off.

The number of switches 17, which turn on and off in accordance with the control signal, is defined as N1. The number of output side transistors 16 connected to the switches 17 is defined as N2. The number of input side transistors 15 connected to the reference current source 12 is defined as N3. The output current changes in accordance with a ratio among N1 to N3. The current per one MOSFET is defined as I, and the variation of current is defined as ΔI. The following equation No. 1 is satisfied.

$$\Delta I = I \times N1 \times N2 / N3. \tag{1}$$

Figure 5:
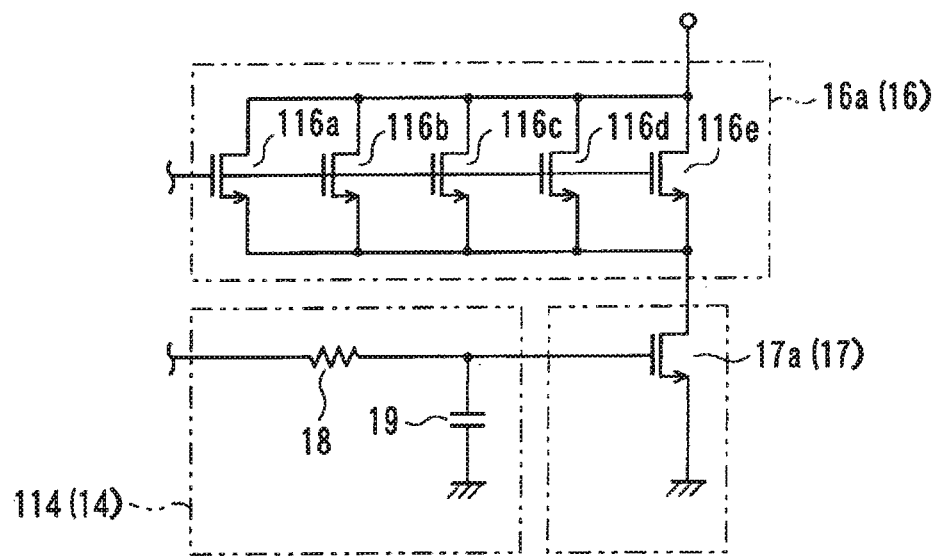
FIG. 5 is a circuit diagram showing a delay unit and one output side transistor.

Here, in order to increase or decrease the current amplification ratio of the current conversion unit 13, each output side transistor 16 is provided by multiple transistors 116a-116e having the same gate width, which are connected in parallel to each other. For example, five transistors 116a-116e provide one output side transistor 16, as shown in FIG. 5. Thus, the current conversion unit 13 has the D/A conversion function for converting the digital control signal to an analog signal and the current amplifying function for amplifying the standard current of the reference current source 12.

When the current conversion unit 13 has integrally both of the D/A conversion function and the current amplifying function, a harmonic component associated with high speed current change may be superimposed with the output current waveform. Thus, in the present embodiment, the delay unit 14 is arranged. The harmonic component is generated according to the current change when the switch 17 turns on and off. The harmonic component is in proportion to the square of the current change (i.e., $(dI/dt)^2$). Accordingly, when the current change is reduced, the harmonic component as the cause of the EMI (i.e., electro-magnetic interference) is also reduced. The current change (i.e., dI/dt) is changed in accordance with a transition time of the control signal for turning on and off the switch 17. Accordingly, when the transition time of the control signal is lengthened, the harmonic component is reduced.

Figure 6:
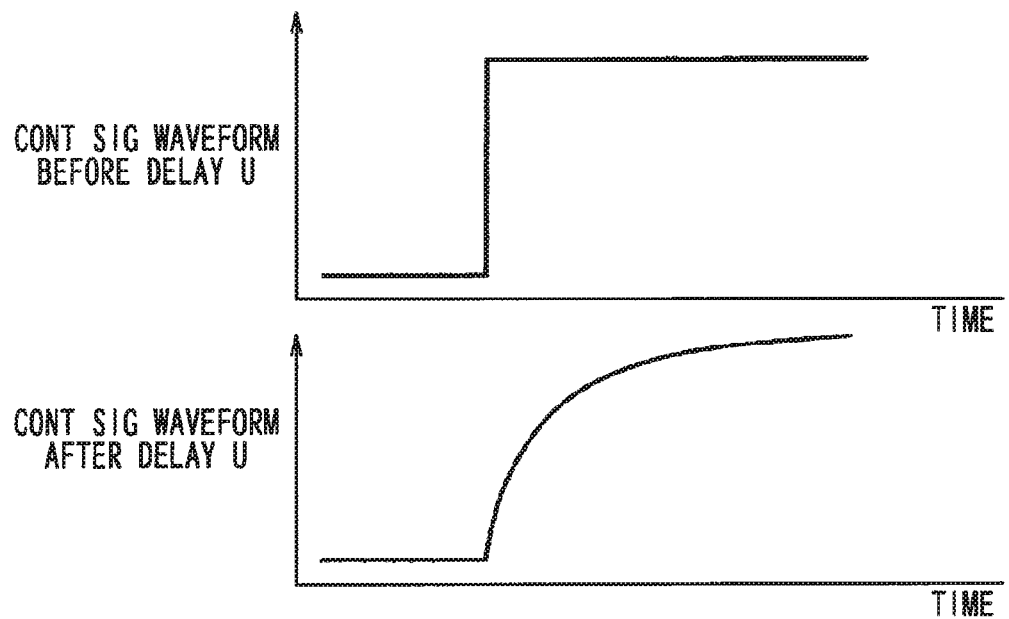
FIG. 6 is a graph showing control signal waveforms before and after the delay unit.

FIG. 5 shows an example of the analog delay circuit 114 as the delay unit 14. FIG. 6 shows an example of the delay output waveform. One the output side transistors 16 shown in FIG. 5 is provided by multiple transistors 116a-116e, which are connected in parallel to each other. One of the switches 17 is connected between the source of each transistor 116a-116e and the ground. the gate of the N channel MOSFET for providing the switch 17 is connected to the analog delay circuit 114 as the delay unit 14. The analog delay circuit 114 shown in FIG. 5 includes a RC delay circuit which includes a resistor 18 and a capacitor 19 connected in series with each other. As shown in FIG. 6, the analog delay circuit 114 smoothly changes the rectangular pulse signal (having a rectangular voltage) to exponentially delayed signal in accordance with a predetermined time constant, and then, outputs the delayed signal to the control terminal (i.e., the gate of the MOSFET) of the switch 17. Although not shown, the analog delay circuit 114 is arranged in each switch 17. In this case, each time constant of the analog delay circuit 114 may be the same or may be different from each other. Here, the time constant is a circuit constant of the RC delay circuit.

The functions and the effects of the above features will be explained. As described above, when the sensor device 3 outputs the response data to the ECU 2, the control circuit 4 converts the binary data defined by a unit of four bits to the ternary symbol for three chips, and outputs the ternary symbol to the controller 9 of the transmitter 5. Here, an example for outputting the current corresponding to the ternary symbol of "120" for three chips will be shown.

The controller 9 converts the ternary symbol of "120" for three chips to "1," "2" and "0" for each chip when the controller 9 outputs the control signal to the current drive circuit 10 in a bus output manner. Then, the controller 9 generates the final control signal having the final values of "00001111," "11111111" and "00000000" as eight bit data, corresponding to "1," "2" and "0," respectively. Then, the controller 9 outputs the final control signal to the switch 17 through the delay unit 14.

When the controller 9 outputs the final control signal having the final value of "00001111," which corresponds to the ternary symbol of "1," to the switch 17, the controller 9 converts the ternary symbol from "00000001," "00000011," "00000111," to "00001111" using the gray code, so that the controller 9 generates the final control signal of "00001111" as the final value, and outputs these control signals to the control terminal of the switch 17 in this order. The switch 17 corresponding to the value of "1" in the control signal turns on. Accordingly, the switches 17 as the objects turn on in turn, so that the synthetic on-state resistance of the output side transistor 16 is gradually reduced, and the output current of the output side transistor 16 is gradually increased. In this case, the signal current waveform suitable for the communication standard is generated.

Figure 7A:
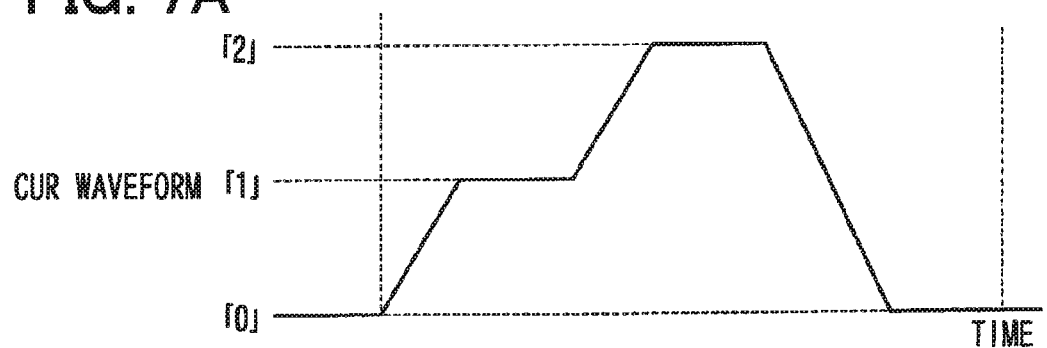
FIG. 7A is a graph showing a target output current waveform.
Figure 7B:
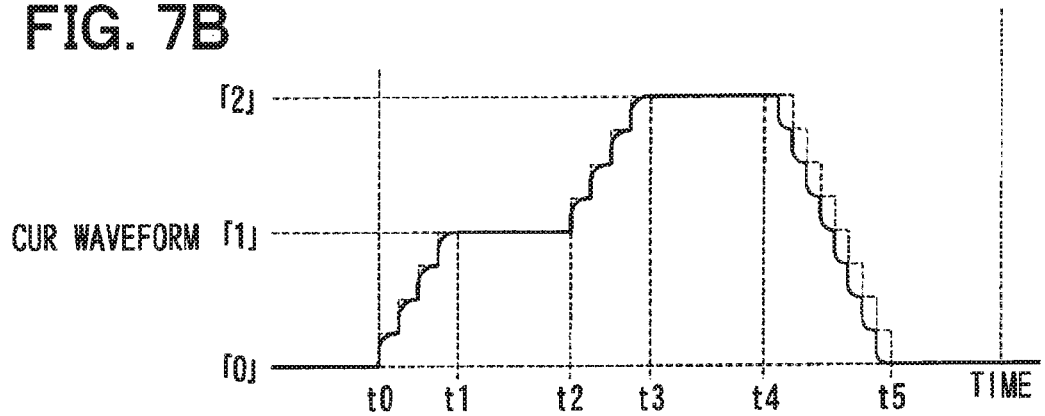

Further, in the above case, the delay unit 14 delays and adjusts the control signal, and then, outputs the control signal to the control terminal (i.e., the gate of the MOSFET) in the switch 17. Thus, the waveform of the output current is shaped, as shown in FIG. 7B. When the switch 17 is gradually switched to the on-state energization, so that the output current is increased much smoothly, shown as a transition from t0 to t1 in FIG. 7B.

After the controller 9 outputs the control signal of "00001111" as the final value to the switch 17, and for example, the predetermined time, which corresponds to the time constant of the analog delay circuit 114 of the delay unit 14, has elapsed, the output current flowing through the transmission line 8 becomes substantially constant. The controller 9 controls the output current to be constant until the predetermined time elapses, which is shown as the transition from t1 to t2 in FIG. 7B.

After that, when the controller 9 outputs the control signal of "11111111" as the final value corresponding to the ternary symbol of "2" to the switch 17, the gray code is used, so that the control signal is changed from "00001111," through "00011111," "00111111," and "01111111," to "11111111." The control signal of "11111111" is the final value. Then, the controller 9 outputs the control signal to the control terminal of the switch 17. These switches turn on in turn. Thus, the combined on-state resistance of the switches 17 and the combined on-state resistance of the output side transistor 16 are gradually reduced, and the output current is increased gradually.

Further, in the above case, since the delay unit 14 delays and adjusts the control signal, and then, outputs the control signal to the control terminal (i.e., the gate of the MOSFET) in the switch 17, the output current is much gradually increased, which is shown as a transition from t2 to t3 in FIG. 7B.

After the controller 9 outputs the control signal of "11111111" as the final value to the switch 17, and, for example, the predetermined time, which corresponds to the time constant of the analog delay circuit 114 of the delay unit 14, has elapsed, the output current flowing through the transmission line 8 becomes substantially constant. The controller 9 controls the output current to be constant until the predetermined time elapses, which is shown as the transition from t3 to t4 in FIG. 7B.

After that, when the controller 9 outputs the control signal of "00000000" as the final value corresponding to the ternary symbol of "0" to the switch 17, the gray code is used, so that the control signal is changed from "11111111," through "01111111," "00111111," "00011111," "00001111," "00000111," "00000011," and "00000001," to "00000000." The control signal of "00000000" is the final value. Then, the controller 9 outputs the control signal to the control terminal of the switch 17. These switches 17 turn off in turn. Thus, the combined on-state resistance of the switches 17 and the combined on-state resistance of the output side transistor 16 are gradually increased, and the output current is reduced gradually.

Further, in the above case, since the delay unit 14 delays and adjusts the control signal, and then, outputs the control signal to the control terminal (i.e., the gate of the MOSFET) in the switch 17, the output current is much gradually decreased, which is shown as a transition from t4 to t5 in FIG. 7B. Thus, the high frequency component is restricted.

The delay state of the analog delay unit 114 is preliminary determined based on the gradation number of the control signal, which is output by the controller 9.

Figure 9A:
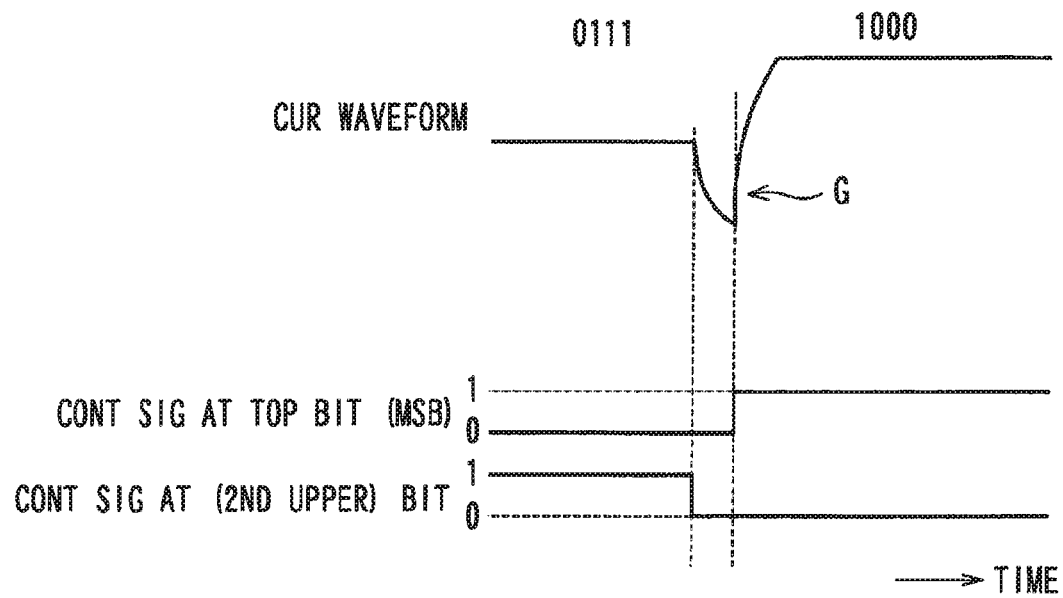
FIGS. 9A and 9B are graphs explaining a reduction effect of glitch.

FIG. 8 shows an example of the code, and indicates a relationship between the binary code and the gray code. Assuming that the binary code is used for the control signal from an initial value to the final value, the example of the code is explained as follows. For example, the binary codes corresponding to the decimal number system of "7" and "8" are "0111" and "1000." If the binary codes are directly used as the control signal, multiple switches 17 turn on and off at the same time. Accordingly, in view of the hardware construction, the transition time of the switches 17 may be different and various, and/or the delay time of the control signal may be variable, so that the switching timings of multiple switches 17 may be shifted. In this case, as shown in FIG. 9A, the glitch G may be generated. Here, when the binary code is used for the control signal, the input side transistor 15 and the output side transistor 16 are arranged to have the mirror current ratio of 1:2:4:8: . . . to obtain the corresponding output current. Thus, the transistors having different gate widths are prepared.

Figure 9B:
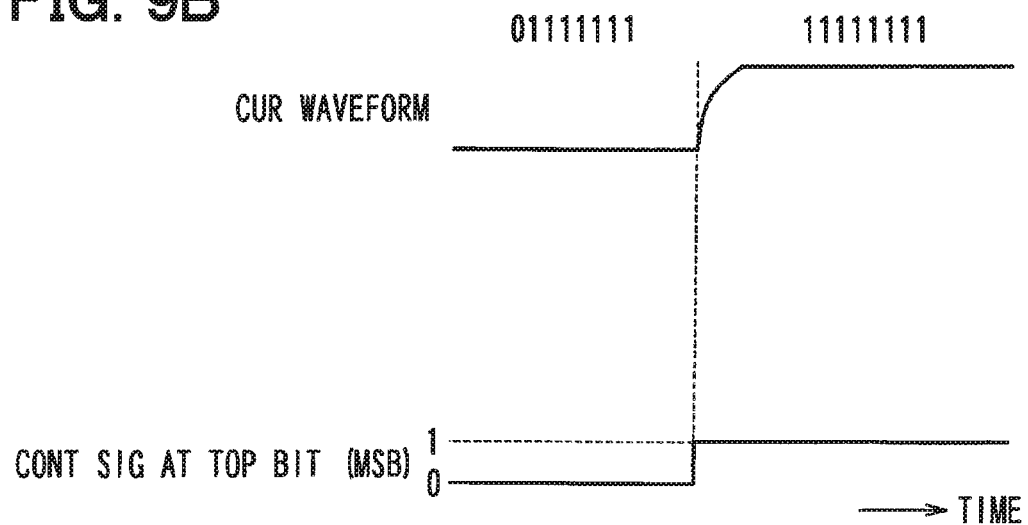

On the other hand, in the present embodiment, the control signal of the controller 9 is prepared by the gray code. In this case, for example, the gray code of the decimal number system of "7" and "8" are "01111111" and "11111111." When the gray code is used for the control signal, multiple switches 17 do not turn on and off at the same time. Accordingly, as shown in FIG. 9B, the glitch G is not generated. As a result, the waveform of the output current meets the standards. When the output current is reduced, the similar condition is met. Further, when the gray code is used, all of the input side transistor 15 and the output side transistor 16 are arranged to have the mirror current ratio of 1:1:1:1: . . . to obtain the corresponding output current. Thus, the circuit structure is easily designed.

For example, the current driver circuit described in JP-3868836 B2 converts a small signal in a D/A conversion manner, and then, amplifies the small signal using the current amplifier circuit so that the large current is obtained. Accordingly, it is necessary to spend much time for charging the gate capacitance and discharging from the gate capacitance in the input and output MOS transistor, which provides the current amplifier circuit, in accordance with the change of the small signal current. Thus, even if the circuit described in JP-3868836 B2 is applied to the digital transmission circuit according to the present embodiment, it is difficult to generate the transmission signal having the high speed slew rate.

On the other hand, in the present embodiment, the current conversion unit 13 having both of the current amplifying function and the D/A conversion function is arranged, and the delay unit 14 is arranged between the controller 9 and the current conversion unit 13. Thus, the output current is changed with the required slew rate in a predetermined range. Further, since the current conversion unit 13 has both of the current amplifying function and the D/A conversion function, which are integrated into the unit 13, the circuit area of the unit 13 is reduced. Even when the current amplifying function and the D/A conversion function are integrated into the unit 13, the change of the output current is gradually reduced by arranging the delay unit 14, and the high frequency noise (i.e., EMI) is reduced.

Further, in the present embodiment, the current conversion unit 13 is used for amplifying the current with reference to the constant standard current as the reference. Further, the controller 9 uses the gray code for the control signal. Thus, the slew rate of the output current in accordance with the change of the ternary symbol such as the transition from "2" to "0" is disposed within the predetermined range, so that the communication standards are satisfied. As a result, the communication between the ECU 2 and the sensor device 3 is stably executed. In the present embodiment, the current conversion unit 13 is prepared without using a resistor.

The delay unit 14 reduces the high frequency noise since the control signal is delayed and adjusted so as to reduce the high frequency component of the output current in multiple output side transistors 16.

The delay unit 14 reduces the high frequency noise since the control signal is delayed and adjusted so as to increase and decrease gradually the combined on-state resistance of multiple output side transistors 16.

The switch 17 is connected in series with the output side transistor 16, and switches between the energization state and de-energization state of the output current from the output side transistor 16 in accordance with the input control signal. The delay unit 14 is provided by the analog delay circuit 114 for delaying the rectangular pulse signal as the control signal to be input into the switch 17 when the energization state and de-energization state of the output current from the output side transistor 16 are switched by the switch 17. Accordingly, the output current is much gradually changed.

Since the switch 17 is connected to the source side of the MOSFET providing the output side transistor 16, it is not necessary to arrange a circuit for restricting an influence, compared with a case where the switch 17 is connected to the gate or the drain.

Second Embodiment

Figure 12A:
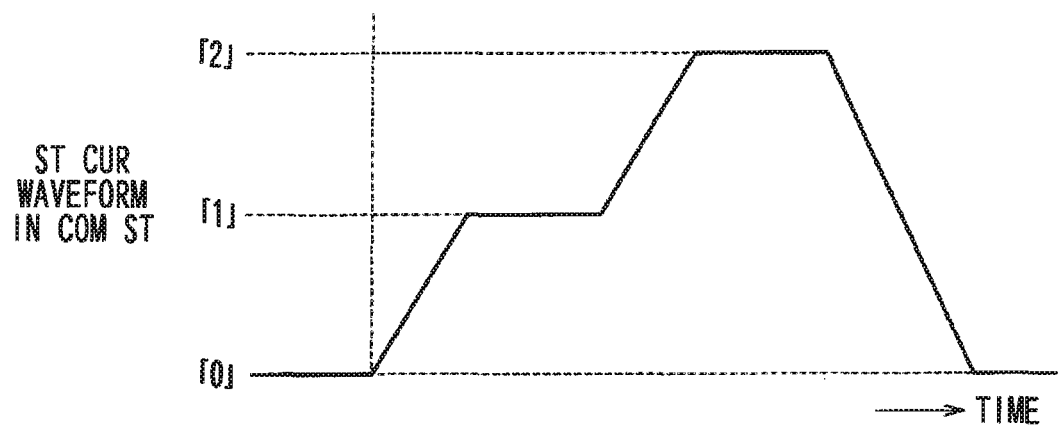
FIGS. 12A to 12C are graphs showing a target output current waveform and an actual output current waveform.

A second embodiment will be explained with reference to FIGS. 10 to 12. In the second embodiment, the delay unit 14 includes the digital delay circuit 214 instead of the analog delay circuit 114.

Figure 10:
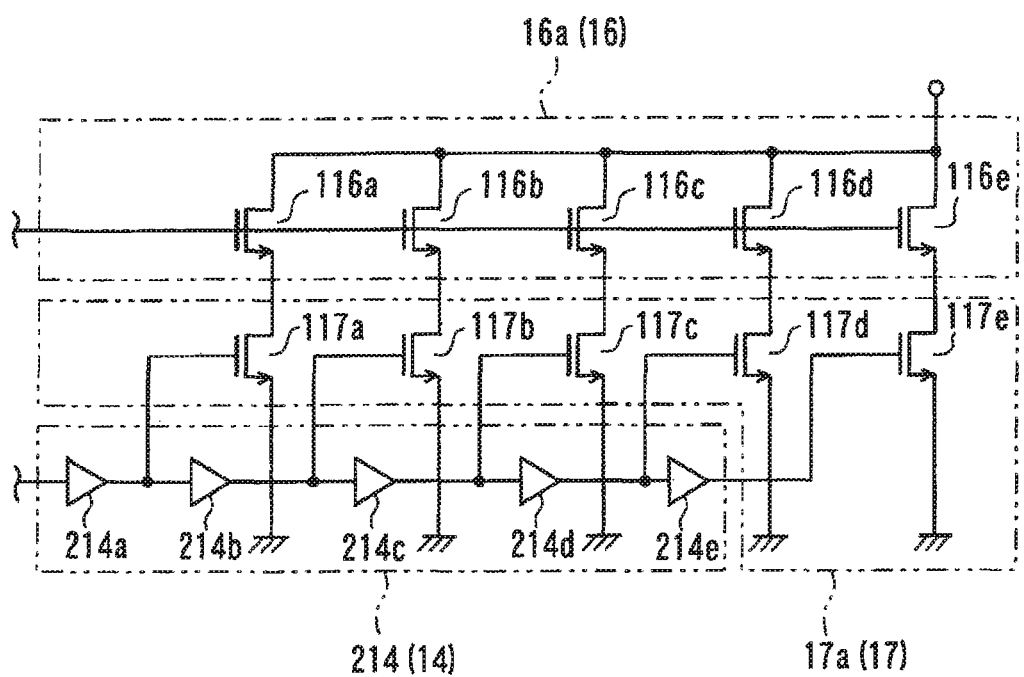
FIG. 10 is a circuit diagram showing a delay unit and one output side transistor according to a second embodiment.
Figure 11A:
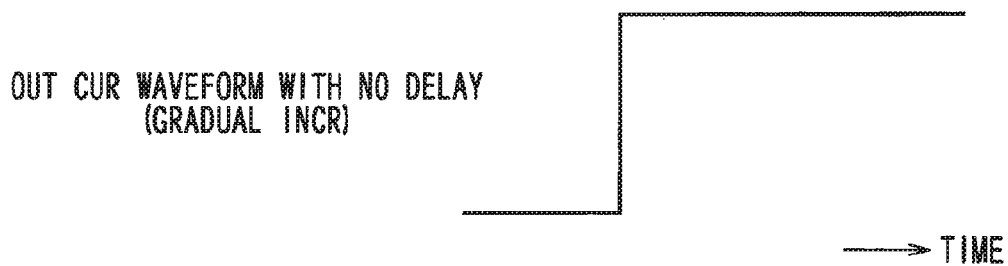
FIGS. 11A to 11D are graphs showing output current waveforms with and without delay.
Figure 11B:
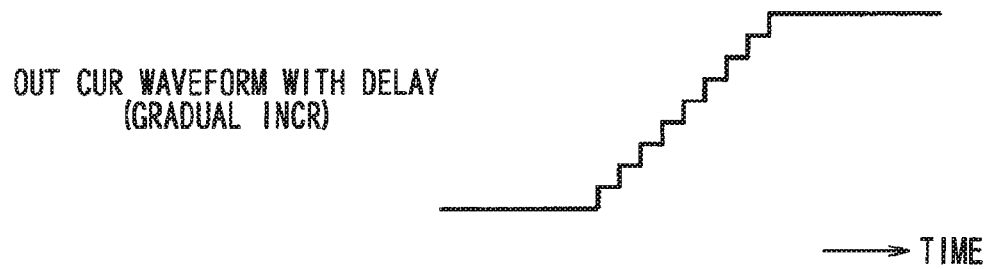
Figure 11C:
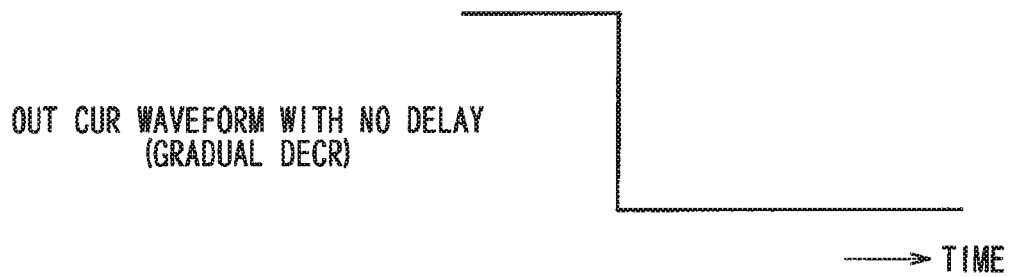
Figure 11D:
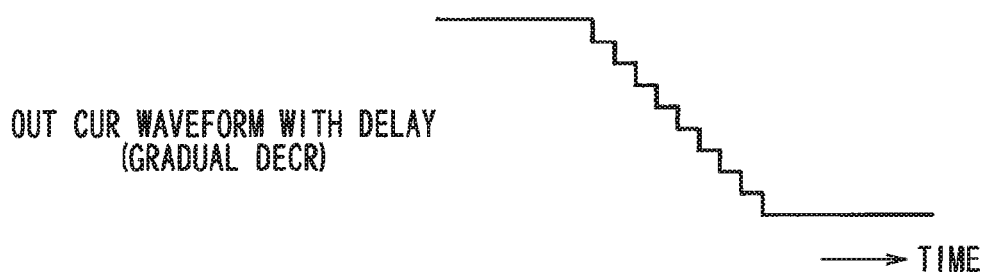

The delay unit 14 according to the present embodiment includes the digital delay circuit 214 as shown in FIG. 10. One of the output side transistors 16 such as a transistor 16a shown in FIG. 10 is prepared by connecting multiple transistor cells as a transistor 116a to 116e in parallel to each other. Each transistor cell 116a-116e is provided by a N channel MOSFET. The sources of multiple transistor cells 116a-116e are connected to switch cells 117a-117e as the switches 17 (which correspond to the switch circuit), respectively. Each switch cell 117a-117e is provided by the N channel MOSFET.

The control terminal (i.e., the gate) of each switch cell 117a-117e is connected to the digital delay circuit 214 as the delay unit 14. The digital delay circuit 214 includes multiple delay elements 214a-214e such as a forward buffer, which are connected to each other in a cascade connection manner. Alternatively, each delay element 214a-214e may be prepared by assembling inverting buffers. The delay elements 214a-214e are respectively connected to multiple gates of the switch cells 117a-117e so as to delay and input the control signal into the gates in turn. The delay elements 214a-214e may have the same structure or the different structures. The delay time of each delay element 214a-214e may be the same or different from each other. FIGS. 11A to 11D show an example of a delay output waveform when the digital delay circuit 214 is used. For example, the output current is increased or decreased stepwisely.

Similar to the first embodiment, when the controller 9 outputs the control signal to the current derive circuit 10 in the bus output manner, the ternary symbol of "120" for three chips is divided into three values of "1," "2" and "0." Eight bit data of "00001111," "11111111" and "00000000" corresponding to these three instruction values are generated as the final value of the control signal in turn. The control signal of the eight bit data is output to the switch 17 through the digital delay circuit 214.

Figure 12B:
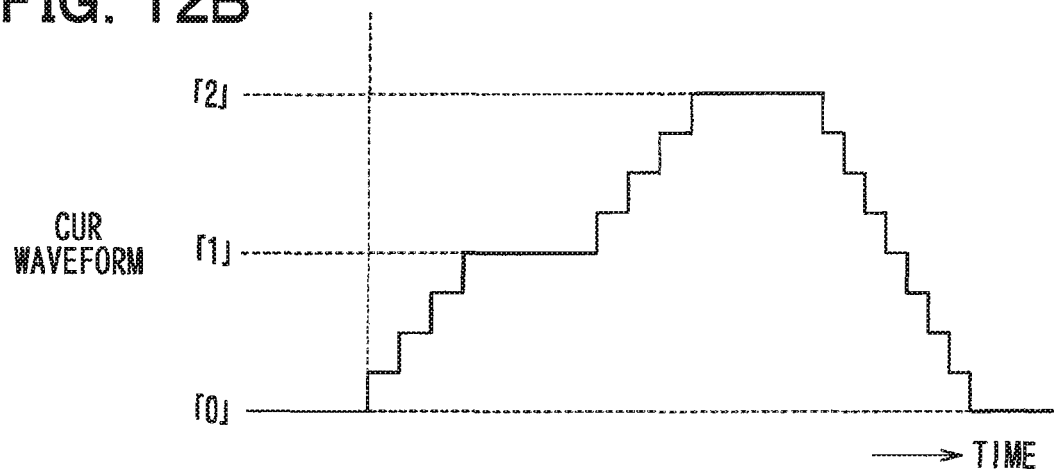
Figure 12C:
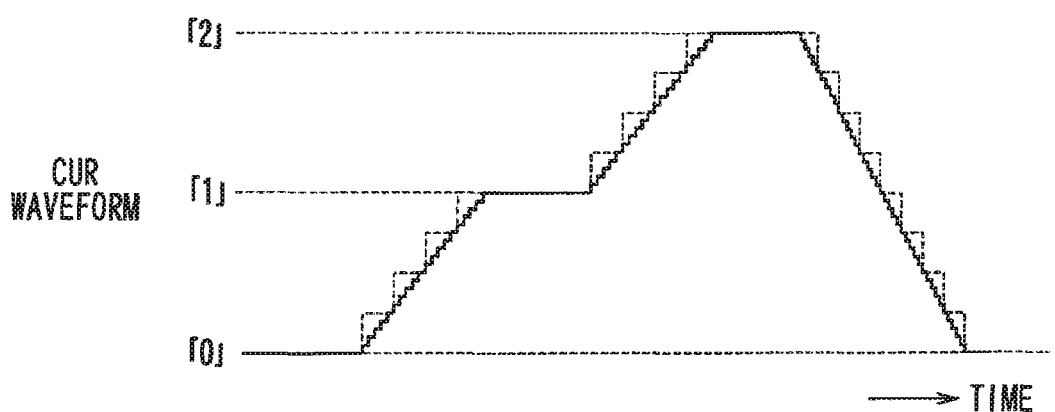

When the controller 9 outputs the control signal having the final value of "00001111" corresponding to the ternary symbol of "1," the gray code is used for the control signal, so that the control signal is generated from "00000001," through "00000011," and "00000111," to "00001111." The signal of "00001111" is the final value. In this order, the control signal is input into the control terminal of the switch 17. The switches 17a-17e corresponding to the control signal of "1" turns on. Thus, as shown in FIG. 12B, the switches 17a to 17e as the object turn on in turn, so that the output current is increased gradually.

The digital delay circuit 214 delays each one bit of the gray code in a bit delay manner, and then, inputs into the control terminal (i.e., the gate of the MOSFET) in the switch cell 117a-117e in turn. The delay state of the digital delay circuit 214 is preliminary determined in view of the gradation number of the control signal output from the controller 9 so as to output an ideal current output waveform, as shown in FIG. 4. As a result, shown as the solid line in FIG. 12C, the output current is much smoothly increased. Similarly, the output current is much smoothly decreased. The present embodiment provides the same or similar effects as the first embodiment.

Other Embodiments

The amplification may be equal to or larger than one time. Alternatively, the amplification may be smaller than one time. The current driver circuit is mounted on the transmitter based on the DSI3 standards. Alternatively, the current driver circuit may be mounted on the transmitter based on other standards. Further, the current driver circuit is used for the communication. Alternatively, the current driver circuit may be used for other purposes.

The analog delay circuit 114 is provided by the RC delay circuit having the resistor 18 and the capacitor 19. The time constant as the circuit constant of the RC delay circuit correcting to each switch 17a-17e may be the same or different from each other. Alternatively, the delay circuit may be a constant current delay circuit provided by the constant current source and the capacitor.

The current driver circuit is provided by the controller 9 and the current drive circuit 10. Alternatively, the current drive circuit 10 having the delay unit 14, in which the control signal is input, without the controller 9 may be the current driver circuit.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A current driver circuit comprising:
   a current conversion unit
      including
         an input side transistor, in which a predetermined reference current is input, and
         a plurality of output side transistors, which output an output current corresponding to the predetermined reference current flowing through the input side transistor, and
      having
         a digital-analog conversion function for converting a digital control signal, which is input into the current conversion unit, to an analog signal, and
         a current amplifying function for amplifying the reference current according to an amplification ratio corresponding to the digital control signal,
      the digital-analog conversion function and the current amplifying function being integrated into the current conversion unit; and
   an adjustment unit adjusting the digital control signal to be input into the plurality of output side transistors, wherein:
   when the adjustment unit adjusts the digital control signal, the current conversion unit changes the amplification ratio to gradually increase or decrease the output current from the plurality of output side transistors, and controls a slew rate of the output current to be within a predetermined range,
   the adjustment unit inputs the digital control signal having a ternary symbol into the plurality of output side transistors so that the plurality of output transistors output the output current having three values, and
   the adjustment unit controls the plurality of output side transistors to output a middle value of the output current to be constant for a predetermined time interval.

2. The current driver circuit according to claim 1, wherein:
   the adjustment unit adjusts the digital control signal to reduce a high frequency component in the output current from the plurality of output side transistors.

3. The current driver circuit according to claim 1, wherein:
   the adjustment unit adjusts the digital control signal to gradually increase or decrease a combined on-state resistance of the plurality of output side transistors.

4. The current driver circuit according to claim 1, further comprising:
   a switch circuit connected in series with the plurality of output side transistors, and switching between an energization state and a de-energization state of the output current from the plurality of output side transistors according to the digital control signal input from the adjustment unit, wherein:

the adjustment unit includes a controller that generates the digital control signal using a gray code, and inputs the digital control signal into the switch circuit when the switch circuit switches between the energization state and the de-energization state of the output current from the plurality of output side transistors.

5. The current driver circuit according to claim 4, wherein:

each of the plurality of output side transistors includes a MOSFET; and the switch circuit is connected to a source side of each MOSFET.

6. The current driver circuit according to claim 1, further comprising:

a switch circuit connected in series with the plurality of output side transistors, and switching between an energization state and a de-energization state of the output current from the plurality of output side transistors according to the digital control signal input from the adjustment unit, wherein:

the adjustment unit further includes an analog delay circuit that delays a rectangular pulse signal as the digital control signal when the switch circuit switches between the energization state and the de-energization state of the output current from the plurality of output side transistors.

7. The current driver circuit according to claim 1, further comprising:

a switch circuit, wherein:

one of the plurality of output side transistors includes a plurality of transistor cells, which are connected in parallel to each other;

the switch circuit switches between an energization state and a de-energization state of an output current from the plurality of transistor cells according to the digital control signal input from the adjustment unit; and the adjustment unit further includes a digital delay circuit that delays the digital control signal in a bit delay manner and inputs the digital control signal into the switch circuit.

8. The current driver circuit according to claim 1, wherein:

the adjustment unit inputs the digital control signal, corresponding to a conversion table, into the plurality of output side transistors.

9. The current driver circuit according to claim 8, wherein:

the conversion table provides the digital control signal not to turn on and off the plurality of output side transistors at the same time.

10. The current driver circuit according to claim 1, wherein:

the output current further includes an initial value and a final value; and the adjustment unit controls the plurality of output side transistors to change the output current from the initial value to the final value via the middle value with time.

11. The current driver circuit according to claim 10, wherein:

when the adjustment unit controls the plurality of output side transistors to change the output current from the initial value to the middle value with time, the plurality of output side transistors gradually increases or decreases the output current; and when the adjustment unit controls the plurality of output side transistors to change the output current from the middle value to the final value with time, the plurality of output side transistors gradually increases or decreases the output current.

12. A current driver circuit comprising:

a current conversion unit
including
an input side transistor, in which a predetermined reference current is input, and
a plurality of output side transistors, which output an output current corresponding to the predetermined reference current flowing through the input side transistor, and
having
a digital-analog conversion function for converting a digital control signal, which is input into the current conversion unit, to an analog signal, and
a current amplifying function for amplifying the reference current according to an amplification ratio corresponding to the digital control signal,
the digital-analog conversion function and the current amplifying function being integrated into the current conversion unit; and an adjustment unit adjusting the digital control signal to be input into the plurality of output side transistors, wherein:

when the adjustment unit adjusts the digital control signal, the current conversion unit changes the amplification ratio to gradually increase or decrease the output current from the plurality of output side transistors, and controls a slew rate of the output current to be within a predetermined range; and the adjustment unit inputs the digital control signal, corresponding to a conversion table, into the plurality of output side transistors.

13. The current driver circuit according to claim 12, wherein:

the adjustment unit adjusts the digital control signal to reduce a high frequency component in the output current from the plurality of output side transistors.

14. The current driver circuit according to claim 12, wherein:

the adjustment unit adjusts the digital control signal to gradually increase or decrease a combined on-state resistance of the plurality of output side transistors.

15. The current driver circuit according to claim 12, further comprising:

a switch circuit connected in series with the plurality of output side transistors, and switching between an energization state and a de-energization state of the output current from the plurality of output side transistors according to the digital control signal input from the adjustment unit, wherein:

the adjustment unit includes a controller that generates the digital control signal using a gray code, and inputs the digital control signal into the switch circuit when the switch circuit switches between the energization state and the de-energization state of the output current from the plurality of output side transistors.

16. The current driver circuit according to claim 12, further comprising:

a switch circuit, wherein:

one of the plurality of output side transistors includes a plurality of transistor cells, which are connected in parallel to each other;

the switch circuit switches between an energization state and a de-energization state of an output current from the plurality of transistor cells according to the digital control signal input from the adjustment unit; and the adjustment unit further includes a digital delay circuit that delays the digital control signal in a bit delay manner and inputs the digital control signal into the switch circuit.

17. The current driver circuit according to claim 12, wherein:

the conversion table provides the digital control signal not to turn on and off the plurality of output side transistors at the same time.

\* \* \* \* \*